(12) United States Patent
Oh et al.

(10) Patent No.: US 9,419,009 B1
(45) Date of Patent: Aug. 16, 2016

(54) 3D NONVOLATILE MEMORY DEVICE

(71) Applicant: SK hynix Inc., Gyeonggi-do (KR)

(72) Inventors: Sung Lae Oh, Chungcheongbuk-do (KR); Dae Sung Eom, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/833,801

(22) Filed: Aug. 24, 2015

(30) Foreign Application Priority Data

Feb. 5, 2015 (KR) ........................ 10-2015-0017764

(51) Int. Cl.
*H01L 27/115* (2006.01)
*H01L 23/528* (2006.01)

(52) U.S. Cl.
CPC ........ *H01L 27/11578* (2013.01); *H01L 23/528* (2013.01); *H01L 27/11526* (2013.01); *H01L 27/11551* (2013.01); *H01L 27/11573* (2013.01)

(58) Field of Classification Search
CPC .... G11C 29/82; G11C 29/822; G11C 29/838; G11C 5/02; H01L 27/10897; H01L 27/11524; H01L 27/1157; H01L 27/2481; H01L 27/11519; H01L 27/11521; H01L 27/11575; H01L 27/792; H01L 27/11541; H01L 27/11568; H01L 27/11573; H01L 27/222
See application file for complete search history.

(56) References Cited

U.S. PATENT DOCUMENTS

| | | | |
|---|---|---|---|
| 8,659,070 B2 | 2/2014 | Tanaka et al. | |
| 2010/0097859 A1 | 4/2010 | Shim et al. | |
| 2011/0305083 A1 | 12/2011 | Shim et al. | |
| 2013/0161821 A1* | 6/2013 | Hwang | ............... H01L 23/5283 257/773 |

FOREIGN PATENT DOCUMENTS

KR   1020100042454   4/2010

* cited by examiner

*Primary Examiner* — Karen Kusumakar
(74) *Attorney, Agent, or Firm* — IP & T Group LLP

(57) ABSTRACT

A 3D nonvolatile memory device is disclosed. The 3D nonvolatile memory device includes a word line stack in which a plurality of word lines are stacked therein and includes a cell region and a slimming region, and pass transistors located below the word line stack, and electrically coupled to the slimming region. A width of the slimming region is larger than that of the cell region.

7 Claims, 6 Drawing Sheets

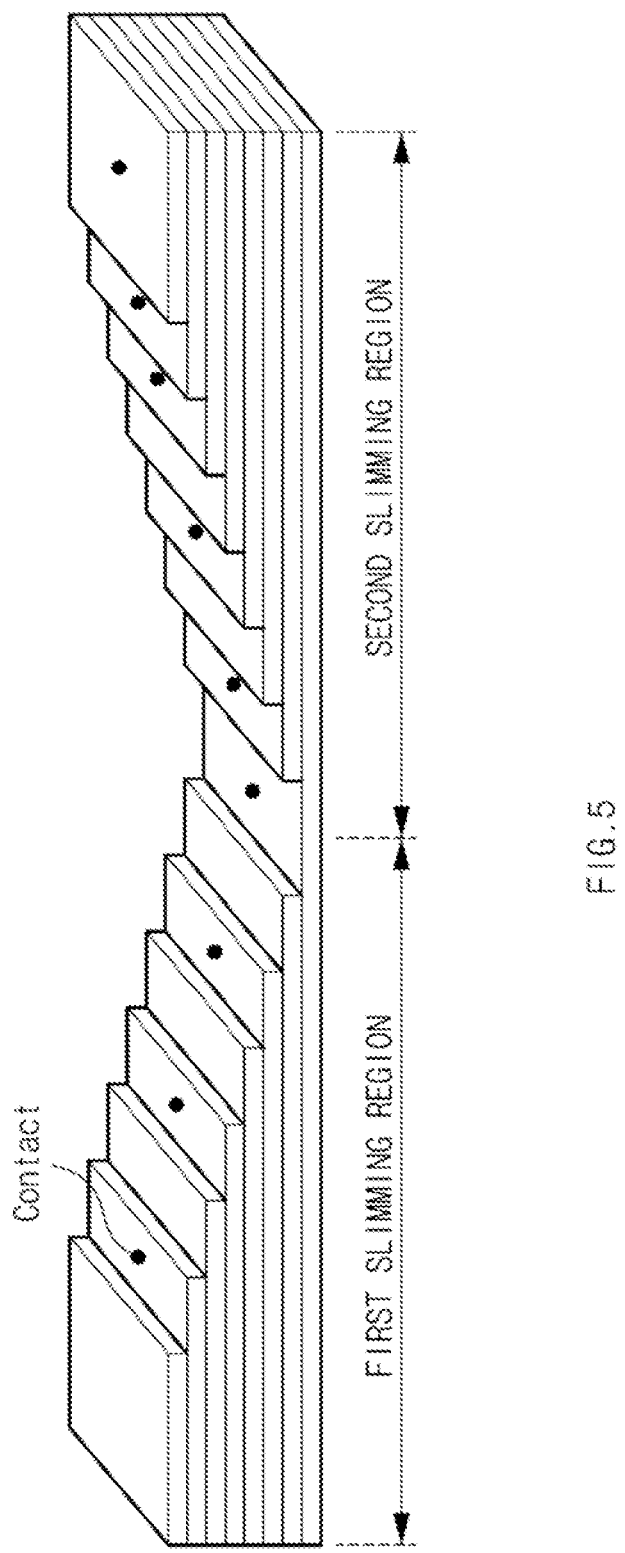

3D NONVOLATILE MEMORY DEVICE

CROSS-REFERENCES TO RELATED APPLICATION

The present application claims priority to Korean patent application No. 10-2015-0017764, filed on Feb. 5, 2015, which is herein incorporated by reference in its entirety.

BACKGROUND OF THE INVENTION

1. Technical Field

Embodiments relate to a three-dimensional (3D) nonvolatile memory device, and more particularly, to a 3D nonvolatile memory device with a stepped slimming region which is formed only in one side of a stack of word lines and has a larger width than a cell region.

2. Related Art

Nonvolatile semiconductor memory devices are memory devices in which stored data is retained even when power is interrupted. Currently, as a degree of integration in the 2D semiconductor devices in which memory cells are two-dimensionally formed on a silicon substrate reaches its limit, 3D semiconductor nonvolatile devices in which memory cells are vertically stacked on a silicon substrate have been proposed.

In the 3D nonvolatile semiconductor devices, a desired memory cell is driven by applying biases to multi-layered word lines stacked on the substrate. Pad parts are formed in the word lines by patterning the word lines formed in the slimming region in the stepped form. The word lines stacked in the multiple layers may be controlled by forming contact plugs and metal interconnections electrically coupled to the word lines.

As the pitch of cell blocks is gradually reduced due to the increase in the degree of integration of the semiconductor devices, the slimming region is arranged in both sides of the word line to ensure the margin as in the 3D nonvolatile memory device in the related art. Pass transistors are arranged in both sides of the cell region.

However, when the slimming regions are formed in the both sides of the word line and the pass transistors are arranged in both sides of the cell region, a plurality of wells for the pass transistors having the same power are formed, thus increasing an area of the slimming regions.

SUMMARY

One or more exemplary embodiments are directed to providing a structure of a slimming region. The slimming region is formed only in one side of a stack of word lines, three-dimensionally stacked, and has a larger width than a cell region.

According to an aspect of an exemplary embodiment, there is provided a three-dimensional (3D) nonvolatile memory device. The 3D nonvolatile memory device may include a word line stack in which a plurality of word lines are stacked therein and includes a cell region and a slimming region; and pass transistors located below the word line stack, and electrically coupled to the slimming region. A width of the slimming region may be larger than that of the cell region.

According to an aspect of an exemplary embodiment, there is provided a three-dimensional (3D) nonvolatile memory device. The 3D nonvolatile memory device may include a first word line stack in which a plurality of word lines are stacked therein and includes a first cell region and a first slimming region; and a second word line stack in which a plurality of word lines are stacked therein and includes a second cell region and a second slimming region. The first slimming region and the second slimming region may be patterned in a stepped form to face each other.

According to an embodiment, a slimming region may be formed only in one side of a word line, and an area of the device may be reduced.

According to an embodiment, the space of the slimming region may be largely ensured due to the improved structure of the slimming region, and a process margin may be ensured.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description in conjunction with the accompanying drawings, in which:

FIG. 5 is an illustrative view illustrating a structure of a contact formed in a slimming region in FIG. 4.

DETAILED DESCRIPTION

Figure 1:
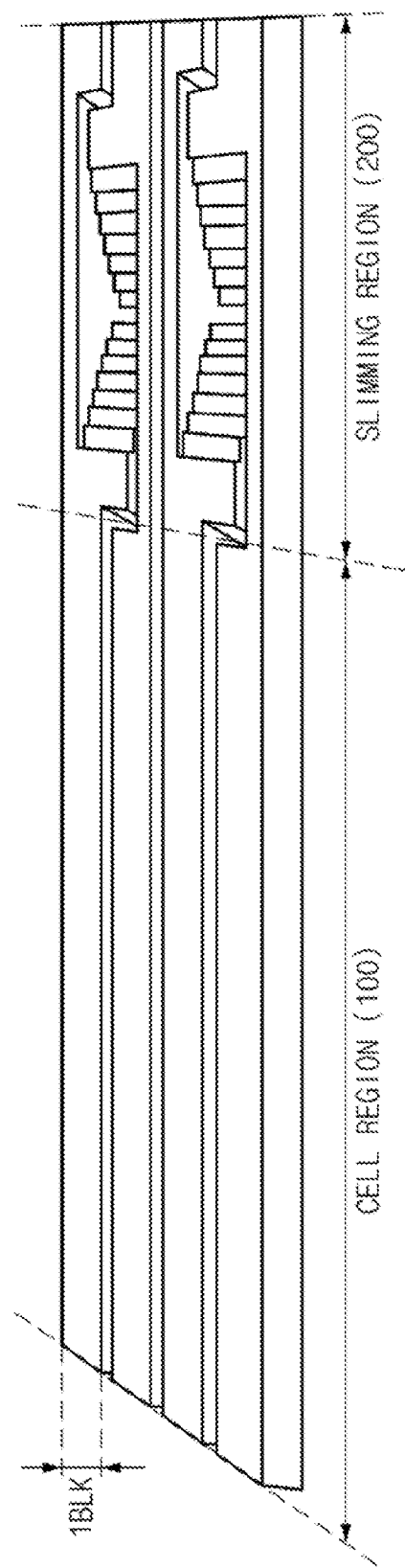
FIG. 1 is a schematic perspective view illustrating a configuration of a semiconductor device according to an embodiment of the inventive concept.

Hereinafter, exemplary embodiments will be described in greater detail with reference to the accompanying drawings. Like reference numerals in the drawings denote like elements, and overlapping descriptions for the same elements will be omitted.

The inventive concept is described herein with reference to cross-section and/or plan illustrations that are schematic illustrations of exemplary embodiments of the inventive concept. However, embodiments of the inventive concept should not be construed as limited to the inventive concept. Although a few embodiments of the inventive concept will be shown and described, it will be appreciated by those of ordinary skill in the art that changes may be made in these exemplary embodiments without departing from the principles and spirit of the inventive concept. Functions or operations described in specific blocks may be performed in an order different from the order described in a flowchart when some embodiments are differently implemented. For example, two continuous blocks may be substantially simultaneously performed, or the blocks may be reversely performed according to related functions or operations.

Figure 2:
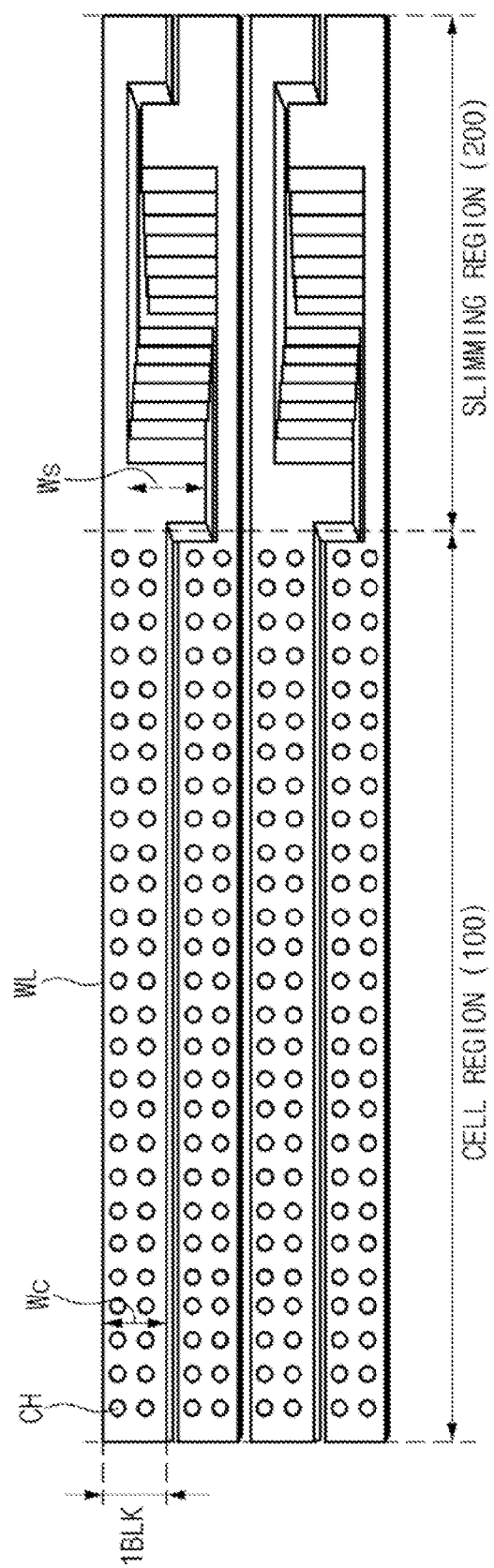
FIG. 2 is a schematic plan view illustrating a configuration of a semiconductor device according to an embodiment of the inventive concept.

FIGS. 1 and 2 are a schematic perspective view and a schematic plan view illustrating a configuration of a 3D nonvolatile semiconductor device according to an embodiment of the inventive concept. For clarity, in the embodiment, the configuration of transistors will be omitted, and only word lines are illustrated.

In the 3D nonvolatile semiconductor device according to an embodiment, a word line stack in which a plurality of word lines WL are stacked with interlayer insulating layers (not shown) being interposed therebetween may be formed on a semiconductor substrate (not shown). The word line stack in each block BLK may include a cell region 100 and a slimming region 200.

The cell region 100 may be a region in which a cell structure is formed, and may include channel layers CH. The slimming region 200 may be a region electrically coupled to pass transistors (not shown) which supply programming voltages to the word lines WL of the word line stack, and the word line stack is patterned in a stepped form in the slimming region 200. The slimming region 200 in each block BLK may be formed only in one side of the cell region 100 to which the programming voltage is supplied through the corresponding slimming region 200, and the pass transistors may be arranged below the slimming region 200.

In an embodiment, the slimming region 200 patterned as the stepped form in each block may be formed to have a width Ws larger than a width Wc of the cell region 100. In an embodiment, the word line stack may be patterned as a stepped form descending in a right direction, in one of slimming regions 200 formed in two adjacent blocks BLK. The word line stack may be patterned as a stepped form ascending in the right direction in the other of the slimming regions 200. Therefore, the two slimming regions 200 may be formed to be symmetrical to each other.

According to the structure and arrangement of the slimming region 200, the slimming region 200 may be formed to have the width larger than that of the cell region 100 without an increase in an entire area of the block. Thus, a process margin may be ensured in a subsequent process for forming contacts electrically coupled to the slimming region 200.

Figure 3A:
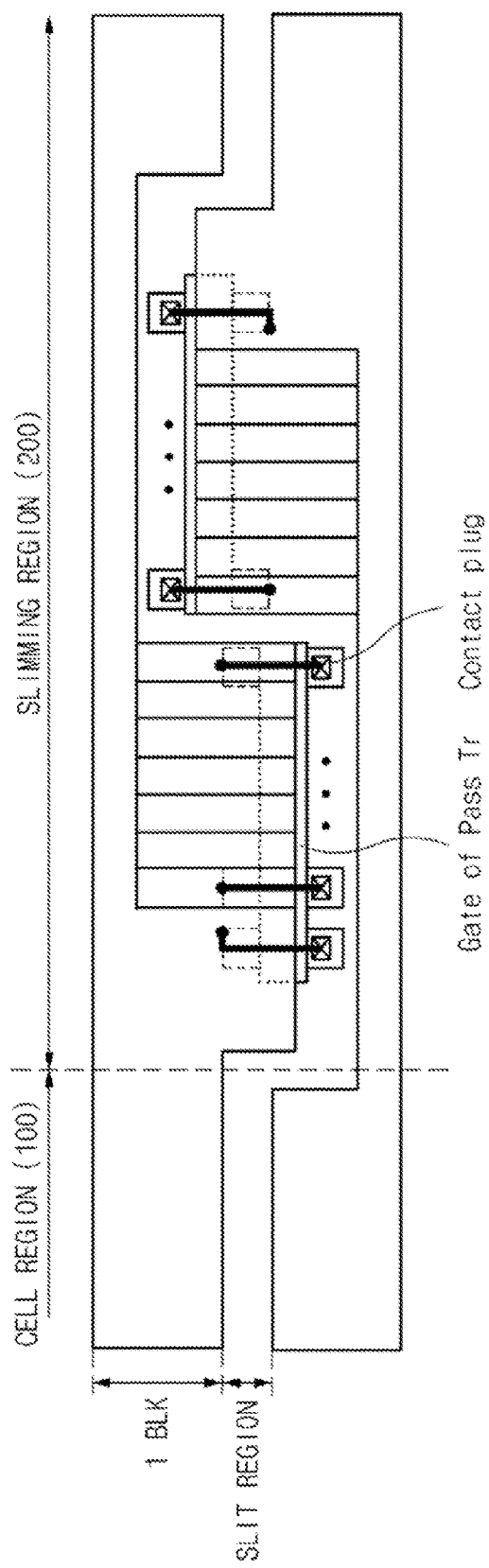
FIG. 3A is a plan view illustrating a connection relationship between word lines and pass transistors in a slimming region according to an embodiment of the inventive concept.
Figure 3B:
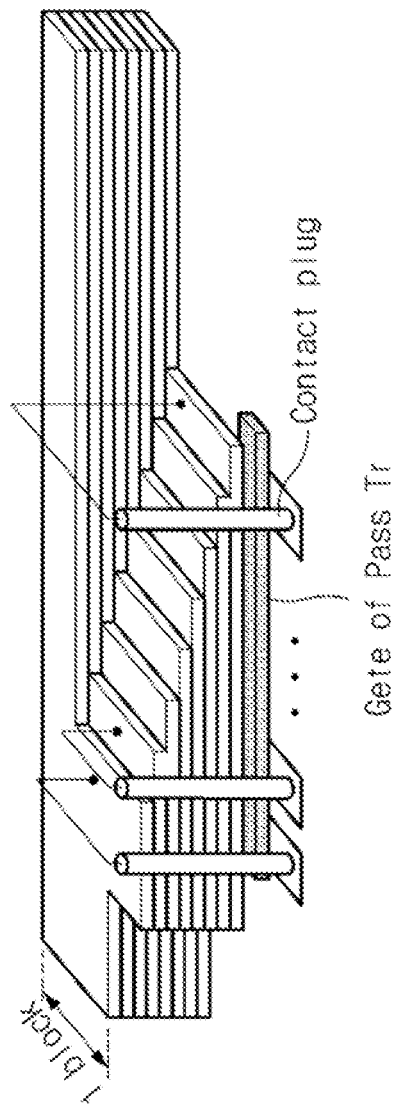
FIG. 3B is a perspective view illustrating a connection relationship between word lines and pass transistors in a slimming region of any one block according to an embodiment of the inventive concept.

FIG. 3A is a plan view illustrating a connection relationship between word lines and pass transistors in the slimming region 200 of FIGS. 1 and 2. FIG. 3B is a perspective view illustrating a connection relationship between word lines and pass transistors in a slimming region of any one block in FIG. 3A.

Pass transistors Pass Tr which supply programming voltages to the word lines WL of the word line stack may be located below the word line stack in the slimming region 200. The pass transistors Pass Tr may be electrically coupled to the word lines WL in the slimming region 200 through contact plugs. Among junction regions for example, source and drain regions of the pass transistors Pass Tr, junction regions which are electrically coupled to the word lines WL may be formed in a slit region, that is, in a space between adjacent word lines WL.

For example, among the junction regions formed in both sides of gates of the pass transistors Pass Tr, junction regions arranged in one side of the gates of the pass transistors Pass Tr may be located in the slit region for device isolation between word lines WL of adjacent blocks. The contact plugs for example, local word lines, configured to couple the corresponding junction regions and the word lines WL may be formed to pass through the slit region, and the pass transistors Pass Tr and the word lines WL may be electrically coupled through the contact plugs.

Junction regions arranged in the other side of the gates among the junction regions formed in both sides of the gates may be coupled to global word lines (not shown) below the word lines WL.

Figure 4:
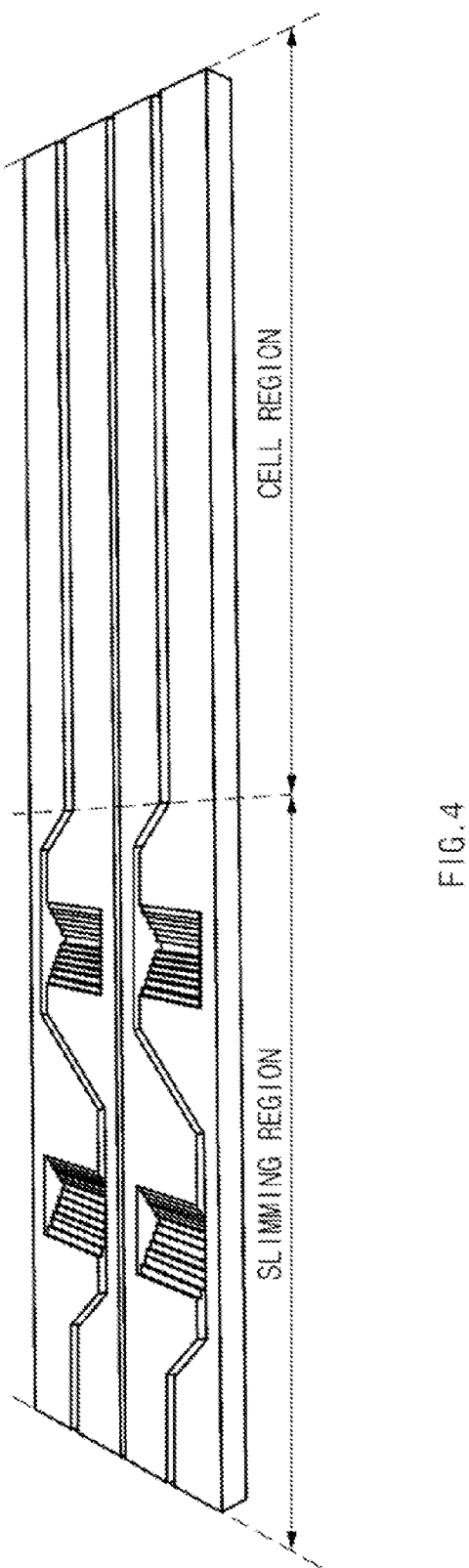
FIG. 4 is a schematic perspective view illustrating a configuration of a semiconductor device according to another embodiment of the inventive concept.

FIG. 4 is a schematic perspective view Illustrating a configuration of a 3D nonvolatile memory device according to another embodiment.

In the embodiment of FIGS. 1 to 3B, the slimming regions of two adjacent blocks may be patterned in a stepped form and arranged symmetrical to each other. That is, in the embodiment, the slimming region formed in each block may be patterned as the stepped form so that the word line stack may be inclined only to one direction for example, the right downward direction or the right upward direction, and the slimming regions in the adjacent blocks may be formed symmetrically to face each other.

However, in an embodiment of FIG. 4, a word line stack in a slimming region of each block may be patterned in a stepped form and have a V-shaped cross-sectional profile. That is, a cross-section taken along a longitudinal direction of the word line of the slimming region in each block has a V-shape. The slimming region in each block may include a first slimming region patterned in a stepped form inclined to the right downward direction and a second slimming region patterned in a stepped form inclined to the right upward direction. The first slimming region and the second slimming region may be formed to symmetrically face each other.

When the slimming region is formed in the V-shaped stepped form, contacts for coupling pass transistors and word lines WL may be formed on the word lines WL. In an embodiment, the contacts may be alternately formed in the first slimming region and the second slimming region as illustrated in FIG. 5. Therefore, the pitch between adjacent contacts may be increased.

In the above-described embodiments, insulating layers are not illustrated between the word lines WL, but it is obvious that the insulating layers for insulation between the word lines may be provided.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A three-dimensional (3D) nonvolatile memory device comprising:
   a first word line stack including a plurality of first word lines and extending from a first cell region to a first slimming region; and
   a second word line stack including a plurality of second word lines and extending from a second cell region to a second slimming region,
   wherein each of the first slimming region and the second slimming region are in a stepped form, and
   wherein the first slimming region and the second slimming region face each other.

2. The 3D nonvolatile memory device of claim 1, further comprising:
   first pass transistors located below the first word line stack and electrically coupled to the plurality of first word lines in the first slimming region; and
   second pass transistors located below the second word line stack, and electrically coupled to the plurality of second word lines in the second slimming region.

3. The 3D nonvolatile memory device of claim 2, further comprising:
   a slit region between the first word line stack and the second word line stack; and contact plugs located in the slit region and configured to electrically couple the plurality of first word lines in the first slimming region to the first pass transistors and electrically couple the plurality of second word lines in the second slimming region to the second pass transistors.

4. The 3D nonvolatile memory device of claim 1,
wherein the first slimming region is in a stepped form,
wherein the first word line stack is inclined in a right downward direction,
wherein the second slimming region is in a stepped form, and
wherein the second word line stack is inclined in a right upward direction.

5. The 3D nonvolatile memory device of claim 1,
wherein a width of the first slimming region is larger than a width of the first cell region, and
a width of the second slimming region is larger than a width of the second cell region.

6. A three-dimensional (3D) nonvolatile memory device comprising:
a cell region and a slimming region, wherein the slimming region is formed at one side of the cell region;
a first word line stack including a plurality of first word lines and extending from the cell region to the slimming region along a first direction;
a second word line stack including a plurality of second word lines and extending from the cell region to the slimming region along the first direction;
a first opening formed in the sliming region and exposing the plurality of first word lines, wherein the plurality of first word lines exposed by the first opening has a stepped structure; and
a second opening formed in the sliming region and exposing the plurality of second word lines, wherein the plurality of second word lines exposed by the second opening has a stepped structure,
wherein the second word line stack in the slimming region is interlocked with the first word line in the slimming region, and
wherein the first and the second openings are arranged side by side along the first direction.

7. The three-dimensional (3D) nonvolatile memory device of claim 6,
wherein the first word line stack in the cell region is located at a first row,
wherein the second word line stack in the cell region is located at a second row,
wherein the first row and the second row are arranged in a second direction perpendicular to the first direction,
wherein the first word line stack in the slimming region protrudes from the first row and extends to the second row along the second direction, and
wherein the second word line stack in the slimming region protrudes from the second row and extends to the first row along the second direction.

* * * * *